(12) United States Patent
Ishihara

(10) Patent No.: US 6,812,522 B2
(45) Date of Patent: Nov. 2, 2004

(54) LATERAL TYPE POWER MOS TRANSISTOR HAVING TRENCH GATE FORMED ON SILICON-ON-INSULATOR (SOI) SUBSTRATE

(75) Inventor: Sho Ishihara, Shiga (JP)

(73) Assignee: NEC Compound Semiconductor Devices, Ltd., Kanagawa (JP)

( * ) Notice: Subject to any disclaimer, the term of this patent is extended or adjusted under 35 U.S.C. 154(b) by 0 days.

(21) Appl. No.: 10/393,288

(22) Filed: Mar. 21, 2003

(65) Prior Publication Data

US 2003/0197240 A1 Oct. 23, 2003

(30) Foreign Application Priority Data

Mar. 28, 2002 (JP) ........................................ 2002-091374

(51) Int. Cl.[7] .............................................. H01L 29/76
(52) U.S. Cl. ...................... 257/330; 257/335; 257/341; 257/343
(58) Field of Search ................................ 257/330, 335, 257/341, 343

(56) References Cited

U.S. PATENT DOCUMENTS

| | | | | |
|---|---|---|---|---|
| 5,227,653 A | * | 7/1993 | Sin | ............................. 257/334 |
| 5,640,034 A | * | 6/1997 | Malhi | .......................... 257/341 |
| 5,914,503 A | * | 6/1999 | Iwamuro et al. | ............. 257/330 |
| 6,285,059 B1 | * | 9/2001 | Tung | ............................ 257/335 |
| 6,465,839 B2 | * | 10/2002 | Takahashi et al. | ........... 257/316 |
| 6,710,403 B2 | * | 3/2004 | Sapp | ........................... 257/330 |
| 2004/0046226 A1 | * | 3/2004 | Himi et al. | .................. 257/499 |

FOREIGN PATENT DOCUMENTS

| | | | | |
|---|---|---|---|---|
| JP | 11-274493 | * | 10/1999 | ............ H01L/29/78 |
| JP | 2003-318404 | * | 11/2003 | .......... H01L/29/786 |

* cited by examiner

*Primary Examiner*—Anh Duy Mai
(74) *Attorney, Agent, or Firm*—Young & Thompson

(57) ABSTRACT

A groove 34 having a generally U-shape cross section is formed in an N⁻ type semiconductor layer 33 of an SOI substrate 30. A P⁻ type well region 36 reaching a buried silicon oxide film 32 is formed in a surface layer on one side of the groove 34 and an N type well region 35 having substantially the same depth as that of the groove 34 is formed in the surface layer on the other side of the groove 34. A PN junction formed by the P⁻ type well region 36 and the semiconductor layer 33 is formed in substantially coplanar with the side wall of the groove 34 on the side of the P⁻ type well region 36. A P type base region 37 having substantially the same depth as that of the groove 34 and adjacent to the side wall of the groove 34 is formed in a surface layer of the P⁻ type well region 36. An N⁺ type drain region 38 is formed in a surface layer of the N type well region 35 and an N⁺ type source region 39 adjacent to the side wall of the groove 34 is formed in a surface layer of the P type base region 37.

7 Claims, 5 Drawing Sheets

LATERAL TYPE POWER MOS TRANSISTOR HAVING TRENCH GATE FORMED ON SILICON-ON-INSULATOR (SOI) SUBSTRATE

BACKGROUND OF THE INVENTION

1. Field of the Invention

The present invention relates to a lateral type power MOS (Metal Oxide Semiconductor) transistor and a fabrication method thereof. In particular, the present invention relates to a lateral type power MOS transistor using an SOI (Silicon On Insulator) substrate and a fabrication method thereof.

2. Description of the Prior Art

A conventional lateral type power MOS transistor 100 using an SOI substrate will be described with reference to FIG. 1. The SOI substrate 20 includes a buried silicon oxide film (SiO$_2$) 2 formed as a buried insulator film on a support substrate 1 of a semiconductor material or an electrically conductive material and an N$^-$ type semiconductor layer 3 formed on the buried silicon oxide film 2. In the semiconductor layer 3, a shallow N type well region 4, which does not reach the buried silicon oxide film 2, and a deep P type base region 5, which reaches the buried silicon oxide film 2, are formed in separate positions of the semiconductor layer 3, respectively. An N$^+$ type drain region 6 is formed in the N type well region 4. In the base region 5, an N$^+$ type source region 7 is formed separately from a PN junction between the semiconductor layer 3 and the base region 5 by a predetermined distance to hold a predetermined channel length. A gate insulating film 8 of thin silicon oxide is formed on a portion of the base region 5 between the semiconductor layer 3 and the source region 7, and a gate electrode 9 of polysilicon is formed on the gate insulating film 8. A field oxide film 10 of thick silicon oxide is formed on a portion of the N type well region 4 between the semiconductor layer 3 and the drain region 6. A drain electrode 12 is formed on the drain region 6 such that the drain electrode is electrically in contact with the drain region 6. A source electrode 13 is formed on the base region 5 and the source region 7 such that the source electrode is electrically in contact with the base region 5 and the source region 7. The drain electrode 12 and the source electrode 13 are electrically separated from the gate electrode 9 by an inter-layer insulating film (SiO$_2$) 11 covering the gate electrode 9.

A fabrication method of the MOS transistor 100 having the above-described construction will be described with reference to FIG. 1 and FIG. 2A to FIG. 2C.

In a first step, the SOI substrate 20 is prepared, in which the N$^-$ type semiconductor layer 3 is formed on the SOI substrate 1 with the buried silicon oxide film 2 interposed therebetween. In the first step, after the field oxide film 10 is formed on the semiconductor layer 3 by LOCOS (Local Oxidation of Silicon), a thin silicon oxide film 21 for ion injection is formed by thermal oxidation. And then phosphor (P) ion is selectively injected into the upper surface portion of the semiconductor layer 3 by using a photolithography technique with a resist pattern 22 used as a mask. After the resist pattern 22 is removed, the N type well region 4 is formed by thermal diffusion of phosphor. A result of the first step is shown in FIG. 2A.

In a second step, the silicon oxide film 21 is removed by wet etching and then the gate insulating film 8 is formed by thermal oxidation. A polysilicon film is grown on the gate insulating film 8 by CVD (Chemical Vapor Deposition) and the gate electrode 9 is formed by removing unnecessary portion of the polysilicon film by dry etching with using a resist pattern as a mask. Thereafter, boron (B) ion is selectively injected into the upper surface portion of the semiconductor layer 3 by photolithography with using the gate electrode 9 and a resist pattern 23 as a mask. After the resist pattern 23 is removed, the deep P type base region 5 reaching the buried silicon oxide film 2 is formed by thermal diffusion of boron. A result of the second step is shown in FIG. 2B.

In a third step, arsenic (As) ion is selectively injected into the upper surfaces of the N type well region 4 and the base region 5 by photolithography with using the gate electrode 9 and a resist pattern 24 as a mask. After the resist pattern 24 is removed, the drain region 6 and the source region 7 are formed in the surface portions of the N type well region 4 and the base region 5, respectively, by thermal diffusion of arsenic. A result of the second step is shown in FIG. 2C.

In a fourth step, a surface of the wafer obtained by the third step is covered by the interlayer insulating film 11 by using CVD. After contact windows are formed in the interlayer insulating film 11 and the gate insulating film 8 such that surfaces of the base region 5, the drain region 6 and the source region 7 are exposed, an aluminum film is formed thereon by sputtering. And then the drain electrode 12, which is electrically in contact with the drain region 6 and the source electrode 13, which is electrically in contact with the base region 5 and the source region 7, are formed by selectively removing the aluminum film with using photolithography and dry etching. A result of the fourth step is shown in FIG. 1.

In forming the base region 5 and the source region 7 of the conventional lateral type power MOS transistor 100 mentioned above, the base region 5 reaching the buried silicon oxide film 2 is formed by ion injection and thermal diffusion with using the gate electrode 9 as the mask. Therefore, the base region 5 becomes laterally widened substantially and the channel length of the channel layer formed in the base region 5 between the source region 7 and the semiconductor layer 3 is elongated. Consequently, there is a problem that the on-resistance is increased. Further, in order to realize a high frequency signal control of the MOS transistor, it is preferable to reduce an output capacitance of the transistor.

SUMMARY OF THE INVENTION

An object of the present invention is to provide a lateral type power MOS transistor having reduced on-resistance and reduced output capacitance and a fabrication method of the same MOS transistor.

The lateral type power MOS transistor according to the present invention, which includes a support substrate formed of an electrically conductive material including a semiconductor material, a buried insulating film, and a semiconductor layer of one conductivity type formed on the buried insulating film. A groove having a generally U-shape cross section is formed in the semiconductor layer, and a gate electrode is formed in the groove with a gate insulating film interposed therebetween. A base region of the other conductivity type having a depth substantially the same as that of the groove is formed in a surface portion of the semiconductor layer adjacent to a side wall of the groove on one side of the groove. A high impurity density source region of the one conductivity type is formed in a surface portion of the base region adjacent to the side wall of the groove. A low impurity density region of the other conductivity type having impurity density lower than that of the base region is formed between the base region and the buried insulating film and a high impurity density drain region of the one conductivity type is formed in the surface layer of the semiconductor layer on the other side of the groove. The present invention is featured by that a PN junction of the low impurity density region of the other conductivity type and the semiconductor layer is formed in substantially coplanar with the side wall of the groove on the side of the base region.

A fabrication method for fabricating this lateral type power MOS transistor includes following steps:

preparing an SOI substrate including an electrically conductive support substrate, a buried insulating film formed therein and a semiconductor layer of one conductivity type formed on the buried insulating film;

forming a low impurity density well region of the other conductivity type reaching the buried insulating film in the semiconductor layer;

forming a groove having a generally U-shape cross section and having depth smaller than that of the well region in the semiconductor layer adjacent to a side wall of the well region and a gate electrode in the groove with a gate insulating film interposed therebetween;

forming a base region of the other conductivity type having substantially the same depth as that of the groove in a surface layer of the well region of the other conductivity type adjacent to the side wall of the groove; and forming a high impurity density source region of the one conductivity type in a surface portion of the base region adjacent to the side wall of the groove and a high impurity density drain region of the one conductivity type in the surface layer of the semiconductor layer on the other side of the groove.

DETAILED DESCRIPTION OF THE PREFERRED EMBODIMENTS

Figure 1:
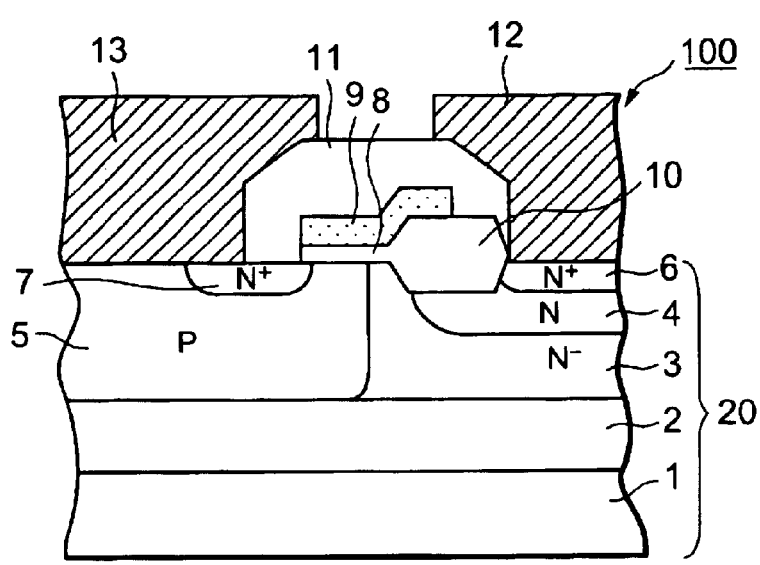
FIG. 1 is a schematic cross sectional view of a conventional lateral type power MOS transistor.
Figure 2A:
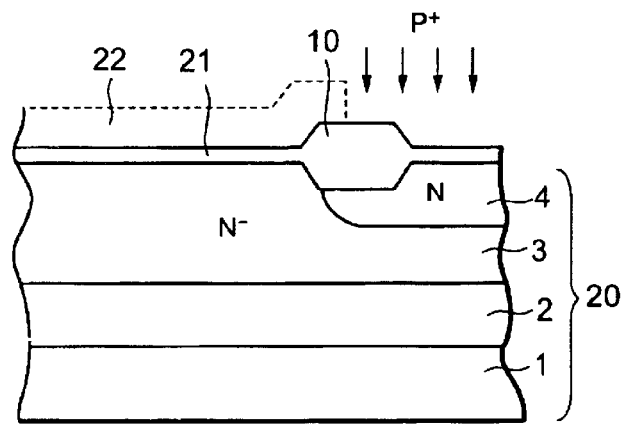
FIG. 2A to FIG. 2C are schematic cross sectional views showing a fabrication steps of the lateral type power MOS transistor shown in FIG. 1.
Figure 2B:
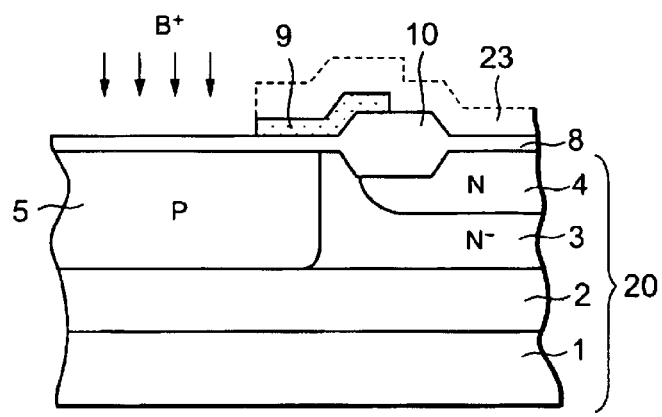
Figure 2C:
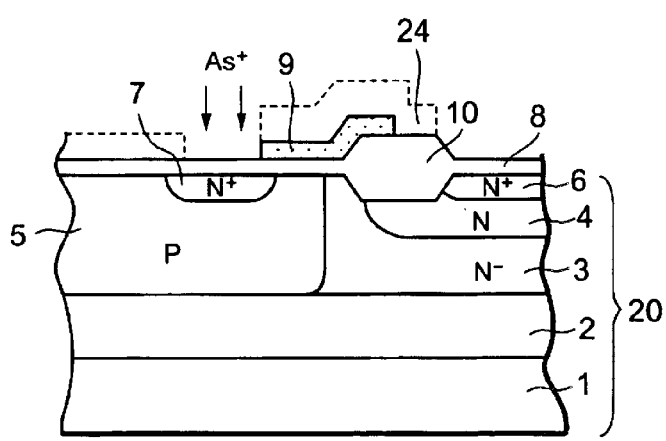
Figure 3:
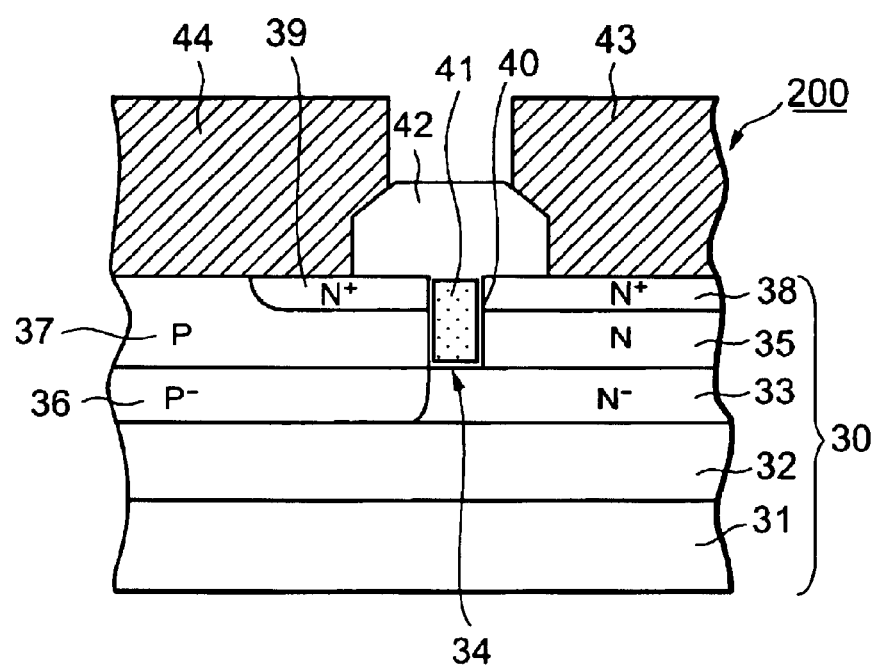
FIG. 3 is a schematic cross sectional view of a lateral type power MOS transistor according to an embodiment of the present invention.

A lateral type power MOS transistor 200 using an SOI substrate according to an embodiment of the present invention will be described with reference to FIG. 3. The SOI substrate 30 includes a semiconductor support substrate 31 of such as silicon, a buried silicon oxide film ($SiO_2$) 32 as a buried insulating film and an $N^-$ type semiconductor layer 33 as a low impurity density semiconductor layer of one conductivity type.

The semiconductor layer 33 is provided with a groove 34 elongating to one direction so as have, for example, a line-shaped pattern or striped pattern in a plan view (not shown). A cross section of the groove 34 orthogonal to the elongating direction thereof has a U-shaped pattern as shown in FIG. 3. A $P^-$ type well region 36 reaching the buried silicon oxide film 32 is formed in a surface layer of the SOI substrate 30 on one side of the groove 34 as a low impurity density well region of the other conductivity type. In the surface layer of the SOI substrate 30 on the other side of the groove 34, an N type well region 35 having depth substantially equal to that of the groove 34 is formed adjacent to a side wall of the groove 34.

A PN junction provided by the $P^-$ type well region 36 and the semiconductor layer 33 is formed in substantially coplanar with the side wall of the groove 34 on the side of the $P^-$ type well region 36. A P type base region 37 having depth substantially the same as that of the groove 34 is formed in a surface layer of the $P^-$ type well region 36 adjacent to the side wall of the groove 34. An $N^+$ type drain region 38 is formed in a surface layer of the N type well region 35 and an $N^+$ type source region 39 is formed in a surface layer of the P type base region 37 adjacent to the side wall of the groove 34.

A gate insulating film 40 in the form of a thin silicon oxide film ($SiO_2$) is formed on an inner wall of the groove 34 and a gate electrode 41 of polysilicon is formed on the gate insulating film 40. A drain electrode 43 electrically insulated from the gate electrode 41 by the insulating film 42 and electrically connected to the drain region 38 is formed and a source electrode 44 electrically in contact with the base region 37 and the source region 39 is formed.

Since, with the above described construction of the lateral type power MOS transistor, the base region 37 forming a channel layer in the depth direction of the groove 34 can be formed to a depth substantially the same as that of the groove 34, it is possible to reduce the channel length to thereby reduce the on-resistance of the lateral power MOS transistor 200. Further, the PN junction, which determines the breakdown voltage between drain and source, is provided by the $P^-$ type well region 36 and the semiconductor layer 33. Since the impurity density of the $P^-$ type well region 36 is lower than that of the base region 37 and the PN junction is formed in substantially coplanar with the side wall of the groove 34 on the side of the base region 37, it is possible to reduce a total area of the PN junction and it is possible to expand the depletion layer to thereby reduce the capacitance of the PN junction and reduce the output capacitance of the lateral power MOS transistor 200.

A fabrication method for fabricating the MOS transistor shown in FIG. 3 will be described with reference to FIG. 4A to FIG. 4E.

Figure 4A:
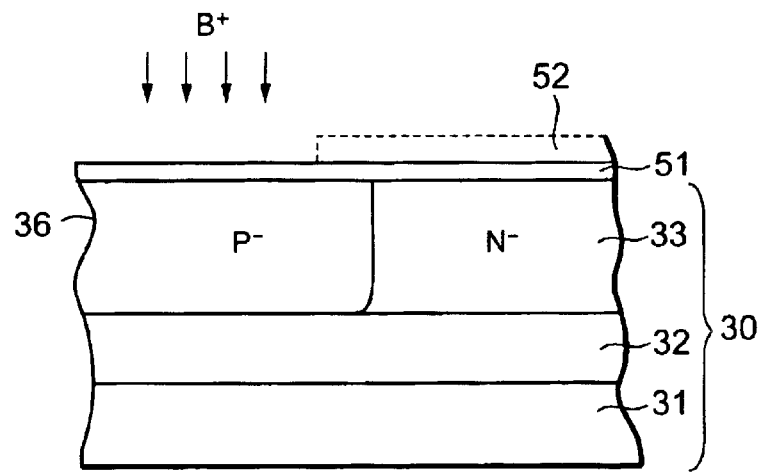
FIG. 4A to FIG. 4E are schematic cross sectional views showing the fabrication steps of the lateral type power MOS transistor shown in FIG. 3.

In a first step, an SOI substrate 31 including an electrically conductive support substrate 31 formed of a semiconductor material such as silicon, a buried silicon oxide film 32 formed therein and an $N^-$ type semiconductor layer 33 formed on the buried silicon oxide film 32 is prepared. And then, a thin silicon oxide film 51 for ion injection is formed on the wafer by thermal oxidation. Boron (B) ion is selectively injected into a surface layer of the semiconductor layer 33 by photolithography with using a resist pattern 52 as a mask. After the resist pattern 52 is removed, a $P^-$ type well region 36 reaching the buried silicon oxide film 32 is formed by thermal diffusion. FIG. 4A shows a result of the first step.

Figure 4B:
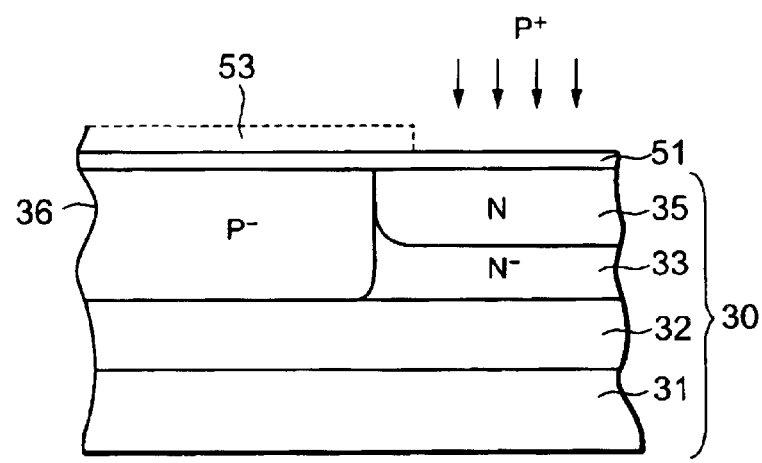

As a second step subsequent to the first step, phosphor (P) ion is selectively injected into the surface layer of the semiconductor layer 33 by photolithography with using a resist pattern 53 as a mask. After the resist pattern 53 is removed, an N type well region 35 having depth smaller than a distance up to the buried silicon oxide film 32 by thermal diffusion of phosphor ion. FIG. 4B shows a result of the second step.

Figure 4C:
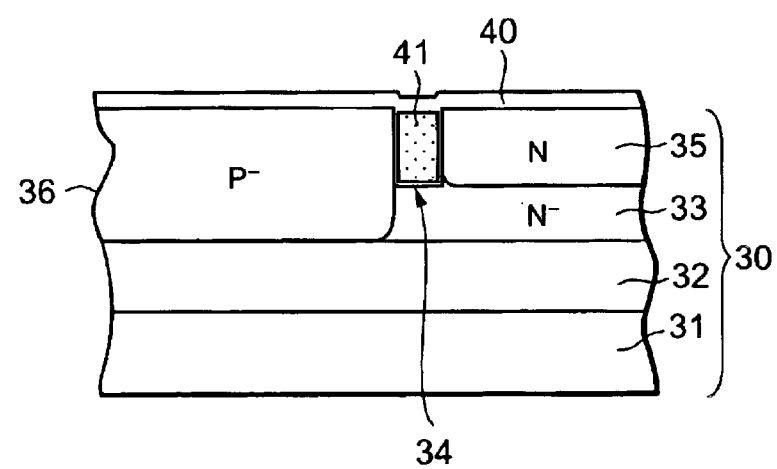

In a third step, a groove 34 having a generally U-shape cross section and depth substantially the same as that of the N type well region 35 is formed in the N type well region 35 adjacent to a side wall of the P⁻ type well region 36. After a gate insulating film 40 is formed on an inner wall surface of the groove 34 by thermal oxidation, a polysilicon film is buried in the groove 34 by CVD and, by removing an unnecessary portion of the polysilicon by etching back the polysilicon film by dry etching, a gate electrode 41 is formed. FIG. 4C shows a result of the third step.

Figure 4D:
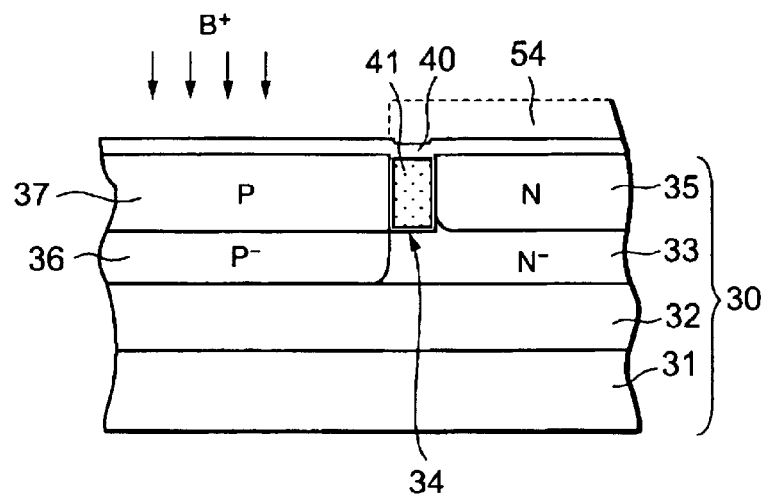

In a fourth step, boron (B) ion is selectively injected into a surface layer of the P⁻ type well region 36 by photolithography with using a resist pattern 54 as a mask. After the resist pattern 54 is removed, a P type base region 37 having substantially the same depth as that of the groove 34 is formed in a surface layer of the P⁻ type well region 36 adjacent to the side wall of the U-shape groove by thermal diffusion of boron. FIG. 4D shows a result of the fourth step.

Figure 4E:
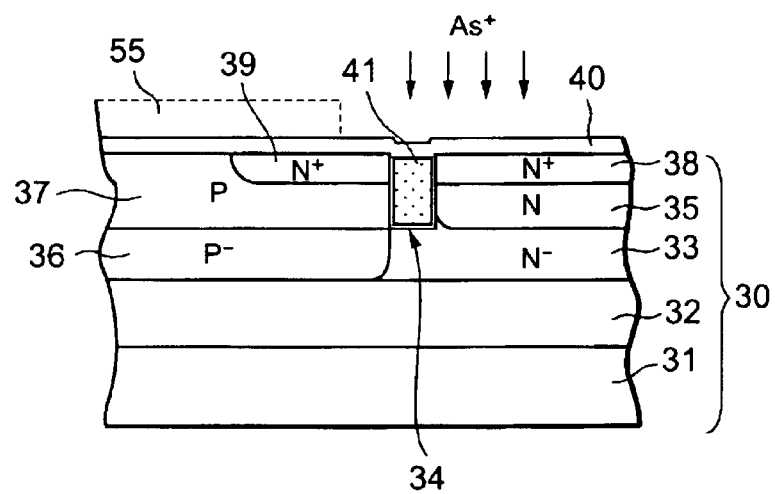

In a fifth step, arsenic (As) ion is selectively injected into surface layers of the N type well region 35 and the P type base region 37 by photolithography with using a resist pattern 55 as a mask. And then, after the resist pattern 55 is removed, a drain region 38 is formed in the surface layer of the N type well region 35 and a source region 39 is formed in the surface layer of the P type base region 37 adjacent to the side wall of the groove 34, by thermal-diffusion of arsenic ion. FIG. 4E shows a result of the fifth step.

In a sixth step, an interlayer insulating film (SiO₂) 42 is formed on the surface of the SOI substrate 30 by CVD to cover the surface. Contact windows are formed in the interlayer insulating film 42 and the gate insulating film 40 such that the P type base region 37, the drain region 38 and the source region 39 are exposed. Thereafter, the wafer is covered by an aluminum film formed by sputtering and, by selectively removing the aluminum film by photolithography and dry-etching, a drain electrode 43 electrically in contact with the drain region 38 and a source electrode 44 electrically in contact with the P type base region 37 and the source region 39 are formed. FIG. 3 shows a result of the sixth step.

According to this fabrication method, the groove 34 having the U shape cross section and depth smaller than the distance from the surface of the wafer up to the buried silicon oxide film 32 is formed in the semiconductor layer 33 adjacent to a side wall of the P⁻ type well region 36 and the base region 37 having substantially the same depth as that of the groove 34 is formed in the surface layer of the P⁻ type well region 36 adjacent to the side wall of the groove 34. Therefore, it is possible to reduce the channel length to thereby fabricate the lateral power MOS transistor 200 having reduced on-resistance. Further, since the PN junction, which determines the breakdown voltage between drain and source, is provided by the P⁻ type well region 36 and the semiconductor layer 33 between the base region 37 and the buried insulating film 32 in substantially coplanar with the side wall of the groove 34 on the side of the base region 37, it is possible to reduce the total area of the PN junction and it is possible to expand the depletion layer to thereby fabricate the lateral power MOS transistor 200 having reduced capacitance of the PN junction and reduced output capacitance.

Although the lateral type power MOS transistor has been described with the one conductivity type and the other conductivity type being N type and P type, respectively, the one conductivity type and the other conductivity type may be exchanged. Further, although the preferable material of the support substrate 31 has been described as semiconductor material, it may be other electrically conductive material.

A typical example of the lateral type power MOS transistor of the present invention will be described below. As the semiconductor support substrate 31, an N type silicon (containing phosphor additive) substrate 300 μm thick having resistance value of 5 Ωcm can be employed. The buried silicon oxide film 32 is about 3 μm thick and the N⁻ type semiconductor layer 33 is about 1 μm thick and has a resistance value of about 0.5 Ωcm. The groove 34 is about 0.5 μm wide and about 0.6 μm deep. As for the groove 34, its width and depth are preferably selected to be within a range of 0.46 μm to 0.54 μm and 0.55 μm to 0.65 μm, respectively. The depth of the phosphor doped N type well region 35 is substantially equal to that of the groove 34, that is, about 0.6 μm and the impurity density thereof is preferably in the order of 1×10¹⁷/cm³. The impurity density of the boron doped P⁻ type base region 36 is preferably in the order of 5×10¹⁷/cm³. The depth of the boron doped P type base region 37 is substantially equal to that of the groove 34, that is, about 0.6 μm and the impurity density thereof is preferably in the order of 1×10¹⁸/cm³. The depth of the arsenic doped N⁺ type drain region 38 as well as the N⁺ type source region 39 is about 0.2 μm and the impurity density is in the order of 1×10²⁰/cm³. The thickness of the gate insulating film 40 of silicon oxide is in the order of 50 nm and the thickness of the gate electrode 41 of polysilicon is 0.45 μm smaller than the depth of the groove 34. The thickness of the interlayer insulating film 42 is 0.5 μm and the thickness of the drain electrode 43 as well as the source electrode 44 may be in a range from 0.5 μm to 1 μm.

According to the lateral type power MOS transistor of the present invention, the channel resistance is reduced by reducing the channel length by making the thickness of the base region in which the channel layer is formed in the depth direction of the groove substantially equal to the depth of the groove. Therefore, it is possible to reduce the on-resistance of the lateral type power MOS transistor compared with the conventional lateral type power MOS transistor. Further, since the PN junction, which is constructed with the low impurity density semiconductor layer 33 of one conductivity type and the semiconductor layer 36 of the other conductivity type whose impurity density is lower than that of the base region is formed in substantially coplanar with the side wall of the groove on the side of the base region, the depletion layer is expanded compared with the conventional transistor and it is possible to reduce the total area of the PN junction and the capacitance of the PN junction. Therefore, it is possible to reduce the output capacitance of the lateral type power MOS transistor compared with the conventional transistor.

What is claimed is:

1. A lateral type power MOS transistor comprising:

a support substrate;

a buried insulating film formed on said support substrate;

a semiconductor layer of a first conductivity type formed on said buried insulating film;

a groove formed in said semiconductor layer of said first conductivity type;

a base region of a second conductivity type formed from a surface of said semiconductor layer of said first conductivity type adjacent to one of side walls of said groove to a depth substantially equal to a depth of said groove;

a high impurity density source region of said first conductivity type formed from a surface of said base region and extending in a depth direction of said base region adjacent to one of said side walls of said groove, an impurity density of said high impurity density source region being higher than that of said semiconductor layer;

a low impurity density region of the other conductivity type formed between said base region and said buried insulating film, an impurity density of said low impurity density region being lower than that of said base region;

a drain region of said first conductivity type formed from a surface of said semiconductor layer on the other side wall of said groove and extending in a depth direction thereof, an impurity density of said drain region being higher than that of said semiconductor layer;

a gate insulating film formed in said groove;

a gate electrode formed on said gate insulating film within said groove and opposing to said base region; and a PN junction formed by said low impurity density region and said semiconductor layer, one end of said PN junction being in contact with said groove and the other end of said PN junction being in contact with said buried insulating film.

2. A lateral type power MOS transistor as claimed in claim 1, wherein an impurity density of a portion of said semiconductor layer, attributing to the formation of said PN junction, is lower than that of a region of said semiconductor layer existing adjacent to said the other side wall of said groove below said drain region to form a low impurity density region of said first conductivity type.

3. A lateral type power MOS transistor as claimed in claim 2, wherein thickness of said low impurity density region of said first conductivity type is smaller than the depth of said groove.

4. A lateral type power MOS transistor as claimed in claim 2, wherein said low impurity density region of said first conductivity type and said low impurity density region of said second conductivity type have the same thickness and are positioned below a bottom of said groove.

5. A lateral type power MOS transistor as claimed in claim 1, wherein the depth of said groove is larger than a width of said groove.

6. A lateral type power MOS transistor as claimed in claim 1, wherein a size of said gate electrode in the depth direction of said groove is smaller than the depth of said groove and the whole of said gate electrode is positioned within said groove.

7. A lateral type power MOS transistor as claimed in claim 1, wherein said support substrate is an N type silicon substrate, said insulating film formed on said support substrate is a buried silicon oxide film, said semiconductor layer of said first conductivity type formed on said insulating film is an $N^-$ type silicon layer, said base region of said second conductivity type is a P type silicon region, said low impurity density region of said second conductivity type is a $P^-$ type silicon region, said high impurity density source region of said first conductivity type and said drain region of said first conductivity type are $N^+$ type silicon regions, impurity densities of said low impurity density region of said second conductivity type formed between said base region and said insulating film and said low impurity density region of said second conductivity type are lower than that of said base region and said gate insulating film is a silicon oxide film.

* * * * *